United States Patent
Barbe et al.

(10) Patent No.: US 7,985,632 B2
(45) Date of Patent: Jul. 26, 2011

(54) METHOD FOR FORMING MICROWIRES AND/OR NANOWIRES

(75) Inventors: Jean-Charles Barbe, Grenoble (FR); Erwan Dornel, Vern sur Seiche (FR); Francois De Crecy, Seyssins (FR); Joel Eymery, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 92 days.

(21) Appl. No.: 12/520,385

(22) PCT Filed: Dec. 20, 2007

(86) PCT No.: PCT/EP2007/064325
§ 371 (c)(1),
(2), (4) Date: Jun. 19, 2009

(87) PCT Pub. No.: WO2008/074862
PCT Pub. Date: Jun. 26, 2008

(65) Prior Publication Data
US 2010/0047973 A1     Feb. 25, 2010

(30) Foreign Application Priority Data
Dec. 21, 2006 (FR) .................... 06 55822

(51) Int. Cl.
*H01L 21/336* (2006.01)
(52) U.S. Cl. ............ 438/151; 257/E21.09; 977/938
(58) Field of Classification Search ........... 438/151, 438/479; 977/938
See application file for complete search history.

(56) References Cited

U.S. PATENT DOCUMENTS

| 5,965,914 A | 10/1999 | Miyamoto | |
|---|---|---|---|
| 2005/0275010 A1* | 12/2005 | Chen et al. | 257/315 |
| 2006/0019459 A1 | 1/2006 | Vinet et al. | |
| 2006/0049429 A1 | 3/2006 | Kim et al. | |
| 2007/0105321 A1* | 5/2007 | Lee et al. | 438/270 |
| 2009/0124050 A1 | 5/2009 | Dornel et al. | |

OTHER PUBLICATIONS

Ming-Chang M. Lee, et al., "Thermal Annealing in Hydrogen for 3-D Profile Transformation on Silicon-on-Insulator and Sidewall Roughness Reduction", Journal of Microelectromechanical Systems, vol. 15, No. 2, XP-002454307, Apr. 2006, pp. 338-343.

(Continued)

*Primary Examiner* — Matthew Smith
*Assistant Examiner* — Christine Enad
(74) *Attorney, Agent, or Firm* — Oblon, Spivak, McClelland, Maier & Neustadt, L.L.P.

(57) ABSTRACT

A method for forming a wire in a layer based on a monocrystalline or amorphous material. The method forms two trenches in the layer, crossing through one face of the layer, separated from each other by one portion of the layer, by an etching of the layer on which is arranged an etching mask, and anneals, under hydrogenated atmosphere, the layer, the etching mask being maintained on the layer during the annealing. The depths and widths of the sections of the two trenches, and the width of a section of the portion of the layer, are such that the annealing eliminates a part of the portion of the layer, the two trenches then forming a single trench in which a remaining part of the portion of the layer forms the wire.

9 Claims, 9 Drawing Sheets

OTHER PUBLICATIONS

Ming-Chang M. Lee, et al., "Silicon Profile Transformation and Sidewall Roughness Reduction Using Hydrogen Annealing", Micro Electro Mechanical Systems, MEMS, 18$^{th}$ IEEE International Conference, XP010811919, Jan. 30-Feb. 3, 2005, pp. 569-599.

Tsutomu Sato, et al., "Micro-structure Transformation of Silicon: A Newly Developed Transformation Technology for Patterning Silicon Surfaces using the Surface Migration of Silicon Atoms by Hydrogen Annealing", Japanese Journal of Applied Physics, The Japan Society of Applied Physics, vol. 39, No. 9A, Part 1, XP-000977143, Sep. 2000, pp. 5033-5038.

Tsutomu Sato, et al., "Fabrication of Silicon-on-Nothing Structure by Substrate Engineering Using the Empty-Space-in-Silicon Formation Technique", Japanese Journal of Applied Physics, The Japan Society of Applied Physics, vol. 43, No. 1, XP-001191452, Jan. 13, 2004, pp. 12-18.

Th Stelzner, et al., "Growth of silicon nanowires by chemical vapour deposition on gold implanted silicon substrates", Nanotechnology, Institute of Physics Publishing, vol. 17, No. 12, Jun. 28, 2006, pp. 2895-2898.

* cited by examiner

METHOD FOR FORMING MICROWIRES AND/OR NANOWIRES

STATE OF THE PRIOR ART

This description concerns a method for forming microwires and/or nanowires in a substrate, and a method for forming a gate all around MOS transistor.

Microwire is taken to mean, here and throughout the remainder of the document, a wire, the section dimensions of which, for example the diameter for a wire of circular section, are between around 1 µm and 1 mm. In the same way, nanowire is taken to mean a wire, the section dimensions of which are between around 1 nm and 1 µm. The term "wire" will be used in the remainder of the document to designate a microwire or a nanowire.

At present, two types of methods exist for forming wires in a semi-conductor material, used for example for microelectronic applications: the growth of wires from catalysts or the etching of a stack comprising the semi-conductor material in which the wires are intended to be formed.

The growth from a catalyst, as described in the document "Growth of silicon nanowires by chemical vapour deposition on gold implanted silicon substrates" by T. Stelzner et al., Nanotechnology, Vol. 17, No 12, 28 Jun. 2006, pages 2895 to 2898, enables wires to be obtained that then need to be connected to be able to be used as element of an electronic circuit. This connection step is generally complex, which may necessitate for example an optimisation of the junctions between the wires and the material with which an electric contact must be made. In addition, the collective manufacture of wires on the scale of a substrate is not industrially viable.

The document U.S. Pat. No. 5,965,914 describes an etching of a stack comprising a semi-conductor material, in which the wires are intended to be formed, which makes it possible to obtain numerous wires stacked one above the other. The wires thereby formed have significant irregularities, complexifying the technological steps carried out subsequently, such as photolithography steps.

DESCRIPTION OF THE INVENTION

Thus there is a need for proposing a solution for forming wires not comprising significant irregularities, by using a new forming method that does not necessitate subsequent complex connection or other steps.

To do this, an embodiment proposes a method for forming at least one wire, in other words a microwire and/or a nanowire, in a layer based on at least one monocrystalline or amorphous material, comprising at least the steps of:
  forming at least two trenches in the layer, crossing through one face of the layer, separated from each other by at least one portion of the monocrystalline or amorphous layer,
  annealing, under hydrogenated atmosphere, the layer,
  the depths P of the two trenches in the layer, the widths L of the sections of the two trenches and the width D of a section of said portion of the monocrystalline or amorphous layer, the sections being in a plane parallel to said face of the layer, being such that the annealing eliminates a part of said portion of the monocrystalline or amorphous layer, the two trenches then forming a single trench in which a remaining part of said portion of monocrystalline or amorphous layer forms the wire.

With such a forming method, and thanks to the annealing under hydrogenated atmosphere, the wire obtained is smooth and does not comprise irregularities, unlike wires obtained directly by etching.

In addition, the wires obtained by this forming method are already connected to the material in which are formed the wires, the ends of the wire being connected to the rest of the monocrystalline or amorphous layer. This method therefore renders unnecessary the complex connection steps required with a method for growing wires from a catalyst.

Another embodiment further concerns a method for forming a gate all around transistor, comprising at least the steps of:
  forming a plurality of trenches in a layer based on at least one monocrystalline or amorphous material, crossing through one face of the layer and forming the contour of source, drain and channel zones, at least two trenches among the plurality of trenches being separated from each other by at least one portion of the monocrystalline or amorphous layer intended to form the channel of the transistor,
  annealing, under hydrogenated atmosphere, the layer,
  the depths P of said two trenches in the layer, the widths L of the sections of said two trenches and the width D of a section of said portion of the monocrystalline or amorphous layer, the sections being in a plane parallel to said face of the layer, being such that the annealing eliminates a part of said portion of the monocrystalline or amorphous layer, said two trenches then forming a single trench in which a remaining part of said portion of monocrystalline or amorphous layer is the wire forming the channel of the transistor.

The method may comprise, after the annealing step:
  a step of depositing a dielectric material in the trenches,
  a step of etching a portion of the dielectric material at the level of a gate zone intended to receive the gate of the transistor,
  a step of oxidising, at the level of the gate zone, the wire, the trench comprising the wire and a part of the monocrystalline or amorphous layer, forming a dielectric layer,
  a step of forming a gate on the dielectric layer surrounding the wire at the level of the gate zone,
  a step of etching the dielectric material located on the monocrystalline or amorphous layer, outside of the trenches,
  a step of forming dielectric spacers around the gate, on the monocrystalline or amorphous layer, and
  a step of implanting dopants in the source and drain zones.

A gate all around MOS transistor is thereby formed, in other words one in which all of the surface of the wire forming the channel of the transistor is covered by the gate.

The trenches may be formed by an anisotropic etching of the layer on which is arranged an etching mask, the pattern of which forms the sections of the trenches at least at the level of said face of the layer.

The etching mask may be maintained on the layer during this annealing step.

In this way, the constraints on the form factor of the trenches necessary for the formation of the wire (microwire and/or nanowire) are reduced. Maintaining the etching mask on the layer during the annealing step further makes it possible to delay in time the breaking of the wire that may occur at the end of a too long annealing with regard to the technological variability of the dimensions of the trenches. In addition, the carrying out of all of the technological steps of the method while maintaining the etching mask during the annealing step enables a planar integration with step jumps uniquely linked to the formation of the gate.

During the annealing step, the etching mask can, in particular, be maintained on the portion of the monocrystalline or amorphous layer of which a remaining part after the annealing is intended to form the wire. In the case of the method for forming a transistor, the etching mask may, in particular, be maintained, during the annealing, on the portion of the monocrystalline or amorphous layer intended to form the wire forming the channel of the transistor.

The dimensions P, L and D may be chosen such that:

$$\left(\pi - a\sin\left(\frac{1}{1+(D/L)}\right)\right)\left(\frac{1+(D/L)}{2}\right)^2 + \frac{1}{2}\sqrt{\frac{D/L}{2}\left(1+\frac{D/L}{2}\right)} \le (P/L) \le 5,$$

$$5 + 2,1(D/L)^2 - 0,011(D/L)^4$$

By respecting this criterion, with the implementation of a forming method described previously, the formation of a wire is obtained.

BRIEF DESCRIPTION OF DRAWINGS

The present invention will be better understood by reading the description of the embodiments given hereafter purely by way of indication and in no way limiting, and by referring to the appended drawings, in which.

Identical, similar or equivalent parts of the different figures described hereafter bear the same numerical reference so as to facilitate moving from one figure to another.

In order to make the figures easier to read, the different parts shown in the figures are not necessary represented to a uniform scale.

The different possibilities (alternatives and embodiments) must be understood as not being exclusive of each other and may be combined together.

DETAILED DESCRIPTION OF SPECIFIC EMBODIMENTS

A method for forming wires, according to a specific embodiment, will now be described in relation to FIGS. 1 to 6.

Figure 1:
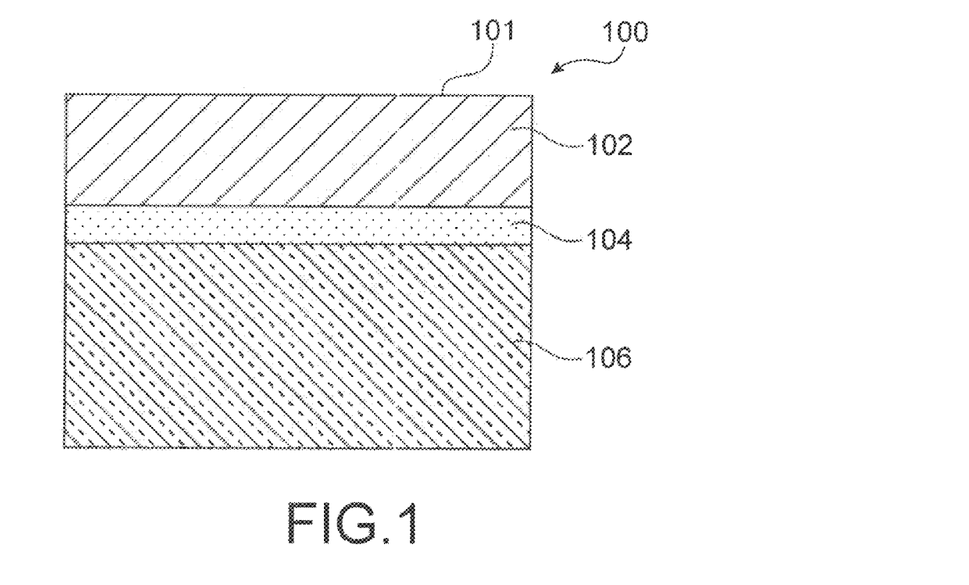
FIGS. 1 to 4 show the steps of a method for forming wires according to a specific embodiment.

A device 100, shown in FIG. 1, comprises a layer 102, for example flat or substantially flat, based on a monocrystalline or amorphous material, such as a semi-conductor material, for example silicon. In this embodiment, the device 100 is an SOI (Silicon On Insulator) type substrate comprising the monocrystalline or amorphous layer 102, at least one insulating layer 104 on which is deposited the layer 102, the insulating layer 104 being itself arranged on a substrate 106 for example based on silicon, and/or quartz and/or any other material compatible with the usual techniques of forming an SOI type substrate. The insulating layer 104 may be formed by a stack of one or several insulating materials, for example silicon dioxide, silicon nitride or diamond-like carbon.

In the case where the monocrystalline or amorphous layer 102 and the substrate 106 are based on silicon, the insulating layer 104 may for example comprise a stack of three under-layers, respectively based on silicon dioxide, silicon nitride and silicon dioxide, the under-layers of silicon dioxide being in contact with the layer 102 and the substrate 106 to assure an optimised bonding of the layer 102 on the insulating layer 104 and the insulating layer 104 on the substrate 106.

The monocrystalline or amorphous layer 102 may for example have a thickness between around 10 nm and 20 μm, this thickness may be adjusted by etching if the original thickness of the layer 102 is too low, or by epitaxy (thereby enabling the crystalline nature of the layer 102 to be conserved) or deposition when the original thickness of the layer 102 is too low. The insulating layer 104 may have a thickness equal to around 145 nm but its thickness may itself be adjusted during the formation of the device 100. When the insulating layer 104 comprises a stack, said stack may be formed by a first under-layer based on silicon dioxide and of thickness equal to around 5 nm, a second under-layer based on silicon nitride and of thickness equal to around 70 nm, and a third under-layer based on silicon dioxide and of thickness equal to around 70 nm. Finally, the substrate 106 may have a thickness between around 500 μm and 800 μm. Preferably, the thickness of the substrate 106 is proportional to the width of the substrate 106 in order to assure a sufficient mechanical rigidity to avoid the breakage of the substrate 106 during the described method.

The material of the layer 102 may also be based on silicon, and/or germanium, and/or silicon-germanium, and/or gallium arsenide, and/or indium phosphide, and/or indium arsenide, and/or gallium and aluminium arsenide, and/or gallium and indium arsenide, and/or quartz, and/or any other crystalline material. Said material may also be an amorphous material, for example silicon dioxide and/or silicon nitride.

Figure 2:
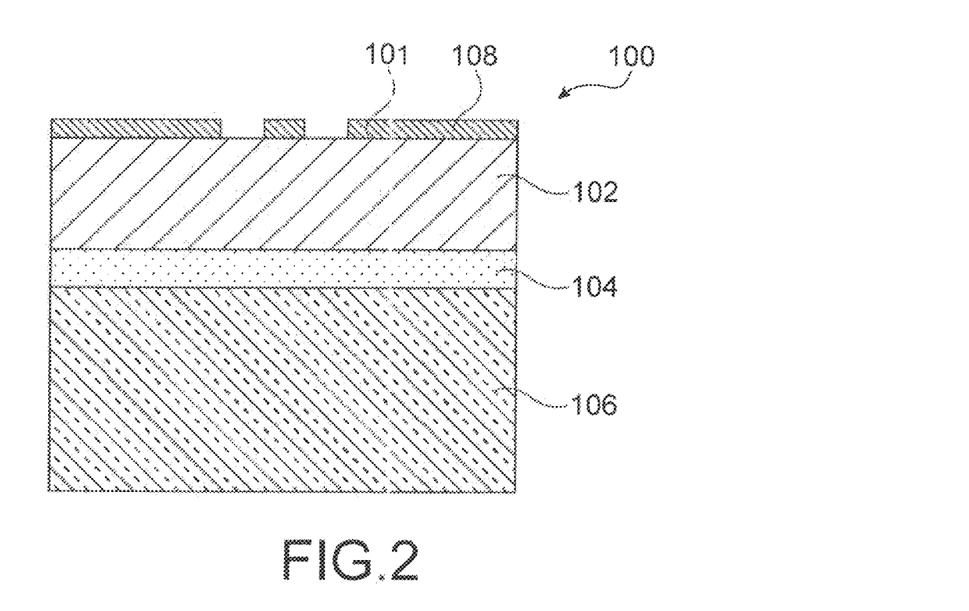

As shown in FIG. 2, an etching mask 108 for example based on silicon dioxide, and/or a stack of silicon dioxide and silicon nitride, and/or again a stack of amorphous carbon and silicon dioxide is formed, for example by photolithoetching, on a principal upper face 101 of the layer 102. The pattern of the etching mask 108 represents the section of at least two trenches, intended to be formed at least in the layer 102, at the level of the face 101.

Figure 3:
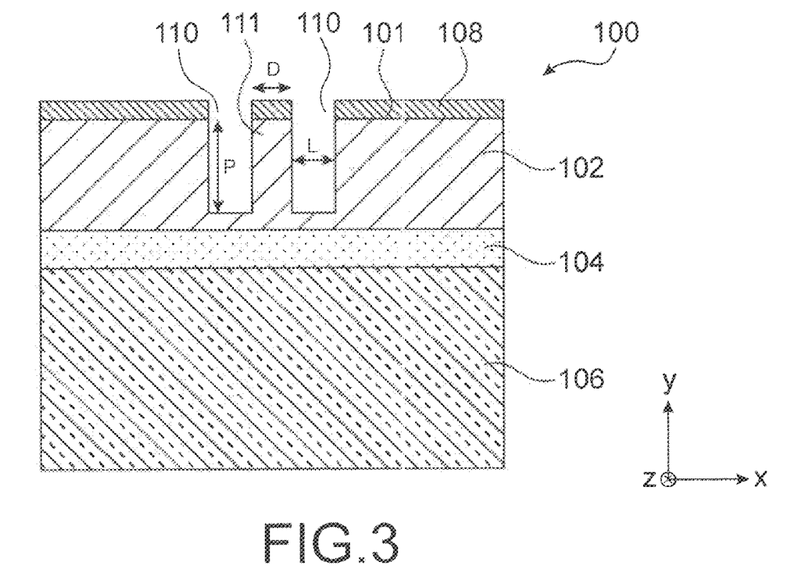

In FIG. 3, two trenches 110 are formed in the layer 102, according to the pattern of the etching mask 108, for example by an anisotropic etching. In this embodiment, the two trenches 110 have a similar shape and dimensions but they could also have a shape and/or dimensions different to each other. Said two trenches 110 are characterised by the distance D separating them, this distance D representing the width, along the axis x shown in FIG. 3, of the portion 111 of the layer 102 separating the two trenches 110, by their depth P, along the axis y shown in FIG. 3, going from the face 101 to the base of the trenches 110, and by their width L, in other words the dimension of the trenches 110, along the axis x, parallel to the width of the portion 111. Finally, the length of the trenches 110 is the dimension of the trenches 110 along the axis z shown in FIG. 3.

An annealing of the device 100 is then carried out, under hydrogenated atmosphere, at a pressure between around 266 Pa and 100000 Pa and at a temperature between around 750° C. and 1150° C., for a duration of around several minutes, for example between around 1 and 10 minutes. The duration of this annealing may also be longer (several tens of minutes) depending on the size of the wire(s) that it is wished to obtain and the quantity of material that needs to be migrated to form said wire.

Figure 4:
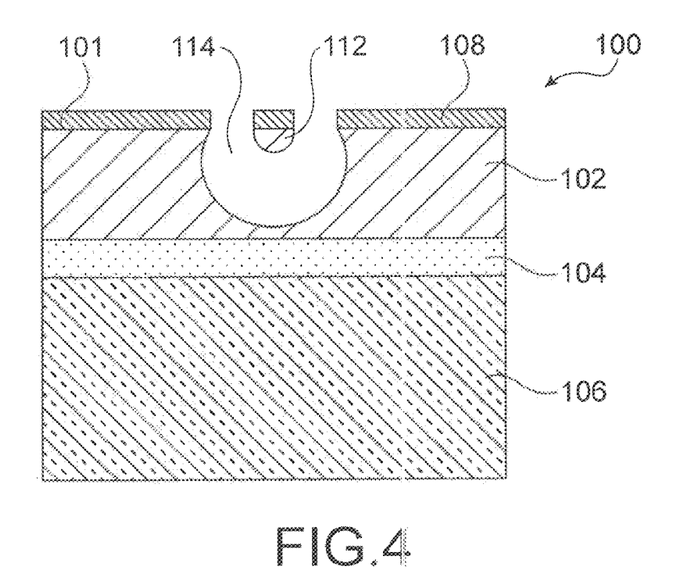

This annealing leads to a widening of the trenches 110, eliminating a part of the portion 111 at the level of the base of the trenches 110, this grouping together of trenches 110 then forming a unique trench 114. The portion 111 of the layer 102, previously separating the two trenches 110, then only forms one wire 112 suspended above in the trench 114, the ends of the wire 112 being connected to the rest of the layer 102. In FIG. 4, the wire 112 has a section of semi-circular shape. The final shape of the wire 112 depends on the surface energies of the material(s) forming the layer 102 and the etching mask 108, as well as the interfacial energy between the material constituting the layer 102 and that constituting the etching mask 108. The shape of the section of the wire 112 is also linked to the dimensions of this section.

The shape and the dimensions of the section of the wire 112 obtained depend on the initial width of the portion 111 of the layer 102 as well as the depth and the width of the trenches 110, in other words the dimensions D, L and P shown in FIG. 3, as well as the time during which the device 100 is annealed. The length of the wire 112 depends on the length of the trenches 110.

Figure 5A:
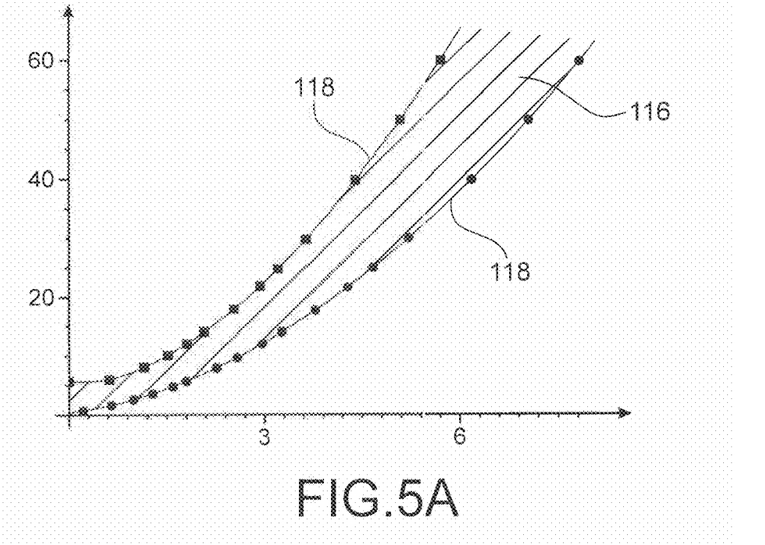
FIGS. 5A, 5B and 6 are graphs showing the ratios of dimensions of trenches formed in the substrate enabling wires to be obtained by the method, according to a particular embodiment.
Figure 5B:
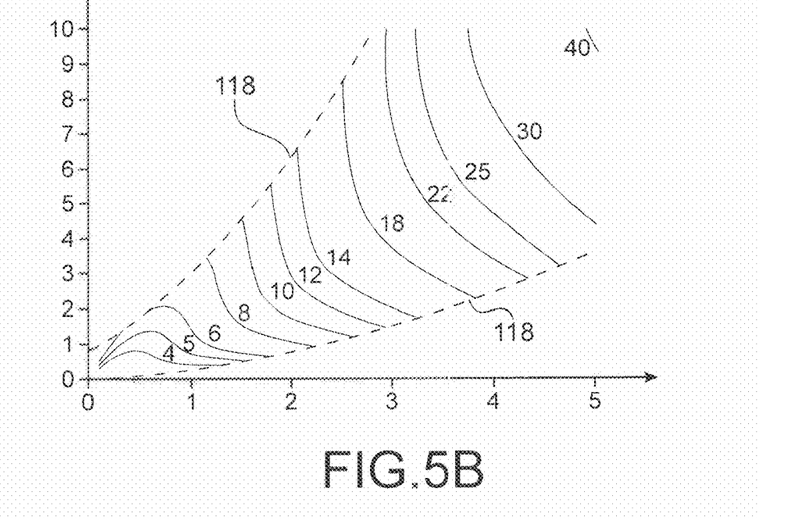

Constraints exist on the dimensions D, L and P to obtain the wire 112 after annealing. A zone 116, delimited by two curves 118 plotted in a frame of reference having for abscissa the ratio D/L and for ordinate the ratio P/L of the trenches 110, is represented in FIG. 5A. The two curves 118 are also shown in FIG. 5B, in which is represented the evolution of the surface area of the section of the wire represented by the ratio $S/L^2$ (S being the value of the surface area) along the ordinate as a function of the ratio D/L along the abscissa, the different values of the ratio P/L being shown on this graph by continuous lines situated between the two curves 118, each of them representing a constant value of P/L indicated above each of them.

When the trenches 110 have dimensions D, L and P such that the abscissa D/L and ordinate P/L point is situated in the zone 116 of FIG. 5A, the annealing of these trenches 110 then leads to the formation of the wire 112. On the other hand, when the dimensions D, L and P of the trenches 110 are such that the abscissa D/L and ordinate P/L point is situated outside of this zone 116, then one obtains either the formation of micro-cavities at the level of the trenches 110, or a filling in of the trenches 110 without the presence of micro-cavities or wire.

For a material in which the surface energy is isotropic, the upper $(P/L)_{upp}$ and lower $(P/L)_{low}$ frontiers 118 illustrated in FIG. 5A may be expressed by the following equations:

$$(P/L)_{sup} = 5.5 + 2.1 \times (D/L)^2 - 0.011 \times (D/L)^4$$

$$(P/L)_{inf} = \left(\pi - a\sin\left(\frac{1}{1+(D/L)}\right)\right)\left(\frac{1(D/L)}{2}\right)^2 + \frac{1}{2}\sqrt{\frac{D/L}{2} \times \left(1 + \frac{D/L}{2}\right)}$$

For example, for trenches such that L=D=50 nm and P/L≈5.5, the surface area S of the section of one of the wires obtained is around $L^2$, i.e. around 2500 nm. By considering a wire of substantially circular section, the radius of the section of said wire is around 28 nm. In another example, for trenches such that L=D=50 nm and P/L≈3.05, the surface area of the apparent section of the wire obtained is around $0.25 \times L^2$, i.e., for a wire of substantially circular section, an equivalent radius of the section of the wire of around 14 nm.

Figure 6:
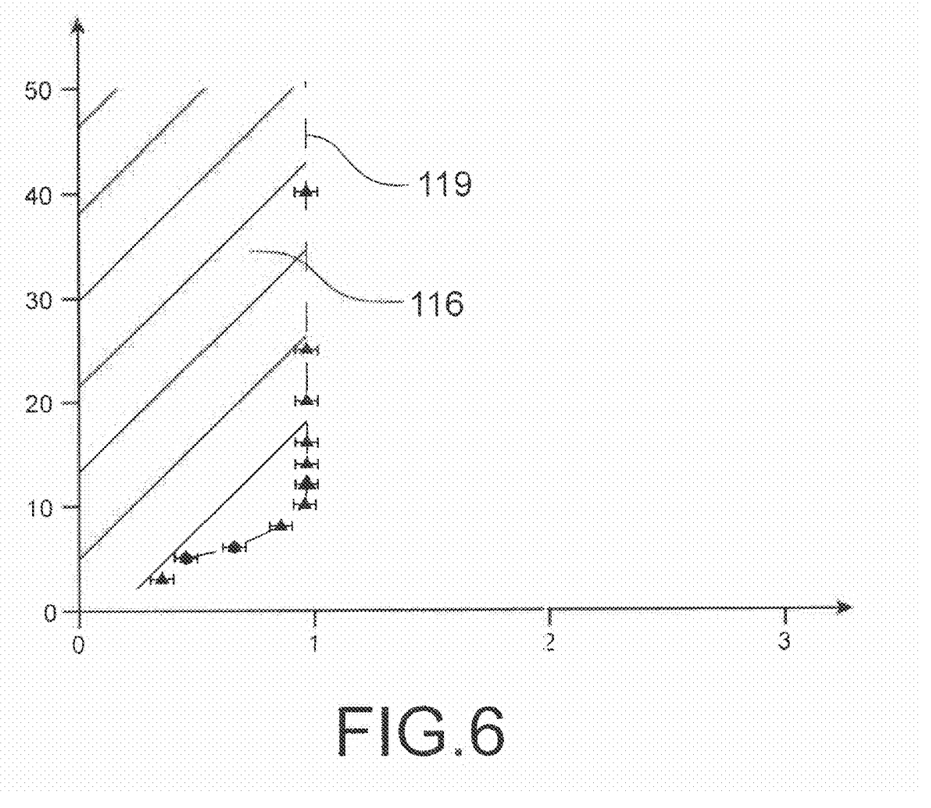

In the method described previously, the etching mask 108 is present on the layer 102 during the annealing of the device 100. In an alternative of this embodiment, the etching mask 108 may be removed from the layer 102 before the annealing of the device 100. The removal of the etching mask 108 before the annealing of the device 100 modifies the reaction of the layer 102 to the annealing. The constraints on the ratios D/L and P/L to obtain the wire 112 from the trenches 110 etched in the layer 102 after an annealing are, in particular, modified. FIG. 6 represents the zone 116 in which, when an abscissa D/L and ordinate P/L point is situated in this zone 116, D, L and P being the dimensions of the trenches 110, the annealing of the layer 102 comprising the trenches 110 then leads to the formation of a wire 112, when the etching mask 108 is removed from the layer 102 before the annealing. The zone 116 of FIG. 5A is different from the zone 116 of FIG. 6. In FIG. 6, it can be seen that the zone 116 is between a curve 119 and the y-axis of the frame of reference of FIG. 6.

By comparing FIGS. 5A and 6, it can be seen that the zone 116 is wider in FIG. 5A than in FIG. 6, in other words when the etching mask 108 is maintained on the layer 102 during the annealing. The ranges of the dimensions D, L and P of the trenches 110 making it possible to obtain the formation of a wire 112 by the method described previously are therefore greater when the etching mask 108 is left on the layer 102 during the annealing. Thus, maintaining the etching mask 108 during the annealing step, particularly on the portion 111 intended to form the wire 112, enables the constraints on the form factor of the trenches formed to be relaxed.

In an alternative of the method described, it is possible to form more than two trenches next to each other, each portion of the layer 102 separating said trenches then being capable of forming a wire.

The forming of wires according to the method described previously may also be obtained while forming a gate all around MOS type transistor 200, shown in FIGS. 15 to 19. FIGS. 7 to 19 show the steps of a method for forming such a transistor.

Figure 7:
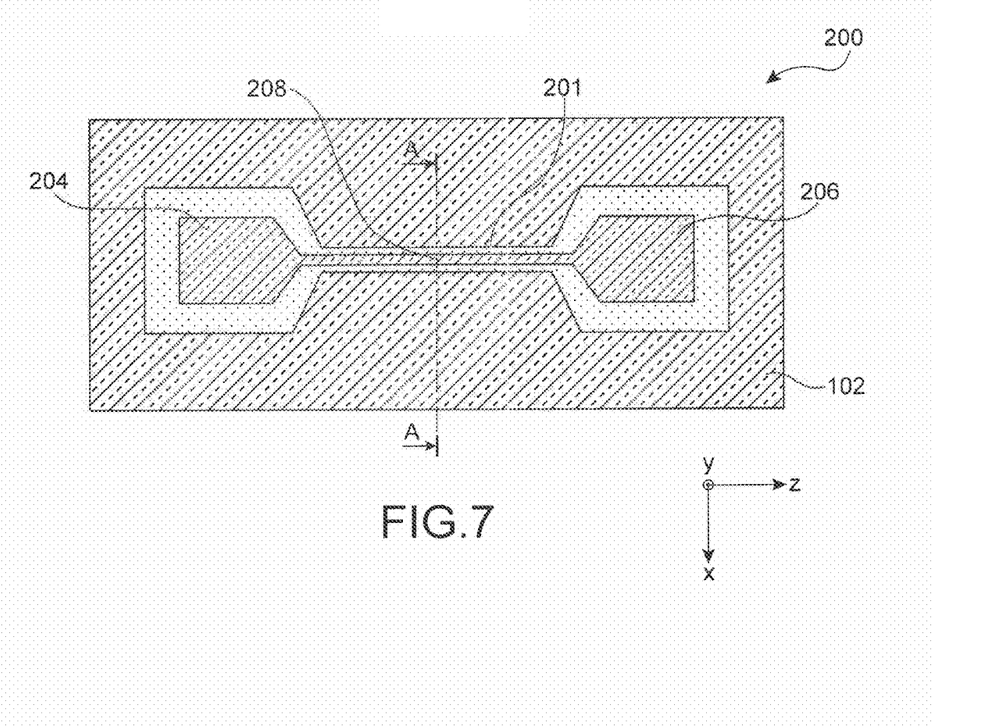
FIGS. 7 to 19 show the steps of forming a gate all around MOS transistor, also according to a particular embodiment.

FIG. 7 is a top view of the layer 102, for example similar to that shown in FIG. 1, from which the transistor 200 is intended to be formed. In an alternative embodiment, the transistor 200 could be formed from an SOI substrate comprising for example the layers 102, 104 and 106, as shown in FIG. 1. The axes x, y and z shown in FIGS. 7 and 8 are similar to those shown in FIG. 3.

In the layer 102, the active portion of the transistor 200 is defined. To do this, trenches 201, known as STI (Shallow Trench Isolation) trenches, are formed, defining the contour of the active portion of the transistor 200. Said trenches 201 may be formed by etching, for example in a similar manner to the trenches 110 described previously, from an etching mask (not shown) formed on the layer 102 and the pattern of which forms the sections of the trenches 201. The active portion of the transistor 200 comprises three zones. two end zones 204 and 206 intended to form respectively the source and drain zones of the transistor 200, and a zone 208, less wide along the axis x than the source 204 and drain 206 zones, intended to form the channel of the transistor 200.

FIGS. 8 to 11 and 13 to 14 are cross-sectional views along the axis AA, shown in FIG. 7, of the layer 102.

Figure 8:
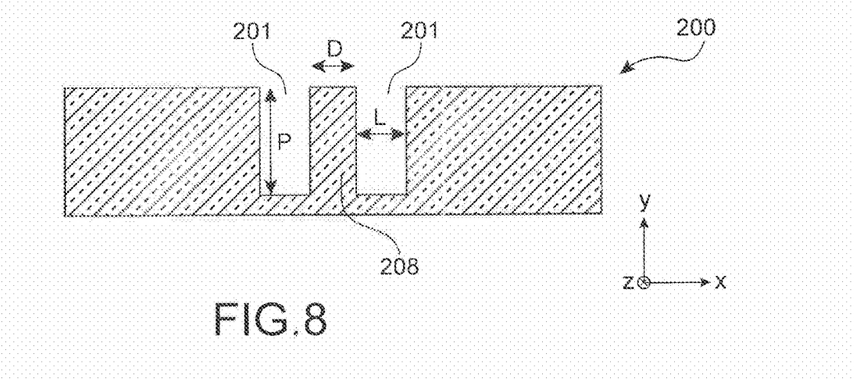

In FIG. 8, the dimension D along the axis x of the portion 208 of the layer 102 separating the two trenches 201 corresponds to the width of this portion 208. Each trench 201 has a width L, and is formed in a depth P in the layer 102. The dimensions D, L and P correspond for example to those of FIG. 3.

An annealing is then carried out, under hydrogenated atmosphere, of the layer 102, for example similar to the annealing of the device 100 described previously. In an analogous manner to the formation of the wire 112 described previously, this annealing leads to a widening of the trenches 201 and an elimination of the base of the portion 208, then forming a unique trench 210 represented in FIG. 9, the remaining part of the portion 208 of the layer 102 then forming a wire 212, the ends of which are connected to the source 204 and drain 206 zones.

Figure 9:
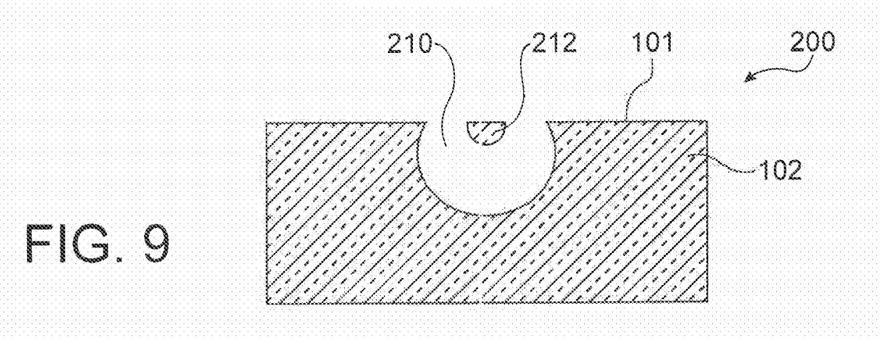

In a manner similar to the method for forming wires described previously, the width, the length, the shape and the size of the wire 212 depend on the dimensions D, L and P, as well as the time of annealing.

The dimensions D, L and P shown in FIG. 8 are chosen such that the abscissa D/L and ordinate P/L point plotted in the frame of reference of FIG. 6 (the etching mask here being removed before the annealing) is situated in the zone 116. If the etching mask used for forming the trenches 201 is maintained on the layer 102 during the annealing, particularly on the portion 208, the dimensions D, L and P are then chosen such that the abscissa D/L and ordinate P/L point plotted in the frame of reference of FIG. 5A is situated in the zone 116.

At the level of the source 204 and drain 206 zones, the width of the trenches 201 formed around these zones is taken voluntarily wide compared to the etched depth so as not to have, after annealing, any buried cavity or wire formed at the level of said trenches. The width of the portion of the layer 102 intended to form the source 205 and drain 206 zones are chosen such that the trenches 201 situated around these zones become rounder, without forming a buried cavity or wire.

A sacrificial oxidation of the wire 212 may be carried out in order to reduce the desired dimension of the section of the wire 212. This step consists in a thermal oxidation of the silicon wire 212, transforming into silicon oxide a part of the silicon of the wire 212, then in a removal of the oxide formed by a solution based on hydrofluoric acid, which is selective with regard to silicon. If the etching mask used for forming the trenches 201 is based on silicon oxide, it is possible to maintain this mask during the annealing step and during this sacrificial oxidation step.

In an alternative of the method for forming the transistor 200 described, it is possible to form the trenches 201 such that the annealing of the layer 102 leads to the formation of several wires connecting the source and drain zones. For example, by forming three trenches next to each other, each trench being for example similar to one of the trenches 201 shown in FIG. 8, and by respecting the constraints on the dimensions D, L and P described previously (conforming to the zones 116 of FIG. 5A or 6), the annealing of said trenches then leads to the formation of two wires, each of these wires may be similar to the wire 212 shown in FIG. 9.

Figure 10:
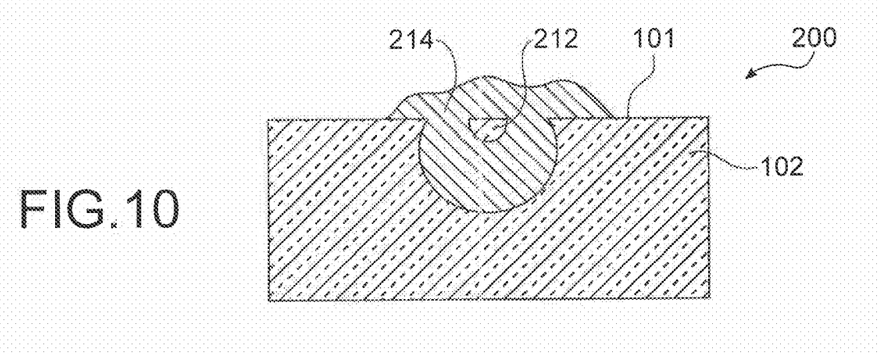

As shown in FIG. 10, the trench 210 at the level of the wire 212 and the other trenches 201 delimiting the source 204 and drain 206 zones of the transistor 200 are then filled with a dielectric material 214, for example based on silicon dioxide.

Figure 11:
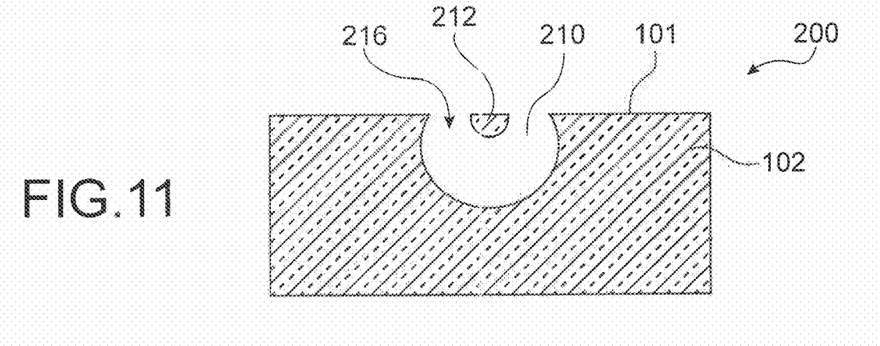
Figure 12:
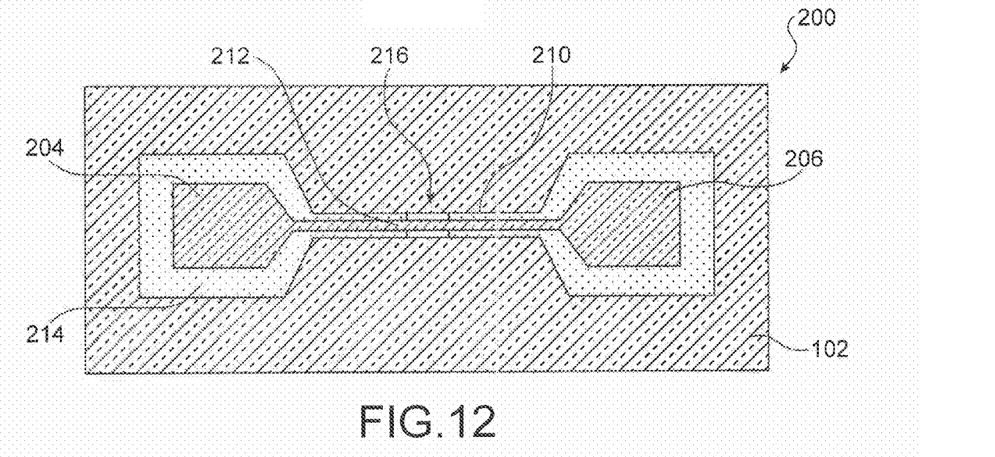
Figure 13:
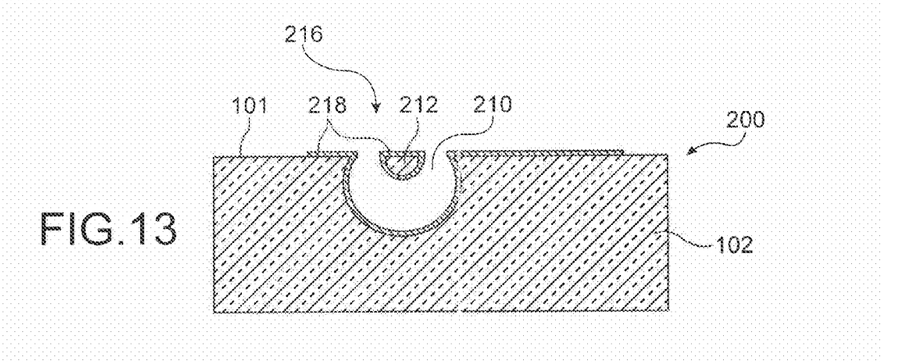

The dielectric material 214 deposited in the trench 210 is then locally etched at the level of a gate zone 216, at the level of which the gate of the transistor 200 is intended to be formed (FIGS. 11 and 12).

The dielectric material 214 may also be deposited in the trenches 201 before carrying out the annealing. In this case, the dielectric material 214 in the trenches 201 at the level of the zone 216 where the wire 212 is intended to be formed is then eliminated by etching, while at the same time protecting by a mask the zones of the dielectric material 214 that is intended to remain in the trenches 210.

A dielectric layer 218 (see FIG. 13) is then formed at the level of the gate zone 216, the wire 212, the trench 210 and a part of the layer 102. This dielectric layer 218 may for example be based on silicon dioxide when it is formed by a thermal oxidation and/or another dielectric, for example hafnium dioxide, when it is formed by a deposition. This dielectric layer 218 is intended to form the gate oxide of the transistor 200. If the etching mask used for forming the trenches 201 has been maintained after the annealing, it is eliminated before forming the gate oxide of the transistor 200.

Figure 14:
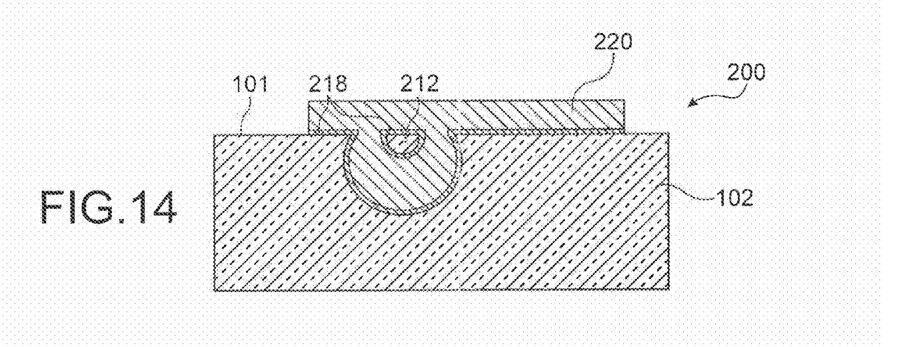

As shown in FIG. 14, a gate 220 of the transistor 200 is then formed by depositing a gate material, for example based on polysilicon if necessary doped in situ, or of a stack of materials, for example based on titanium nitride and polysilicon if necessary doped in situ, then by a mechanical-chemical polishing eliminating the gate materials deposited previously located outside of the gate zone 216. The polishing is then carried out until the dielectric material 214 deposited previously is reached. The gate 220 formed completely surrounds the part of the wire 212 forming the channel of the transistor 200.

Finally, the dielectric material 214 located outside of the trenches 201 and 210 is etched. The etching is stopped at the level of the upper face 101 of the layer 102.

Dielectric spacers 222 are then formed around the gate 220 by depositing a base, for example of silicon dioxide, then a layer of silicon nitride that is then etched in an anisotropic manner to leave portions of the layer of silicon nitride only around the gate 220. The spacers 222 enable the gate 220 to be electrically insulated from the rest of the transistor 200.

Finally, an implantation of dopants in the source 204 and drain 206 zones is carried out, a part of the channel then being protected by the gate 220 during this implantation.

Figure 15:
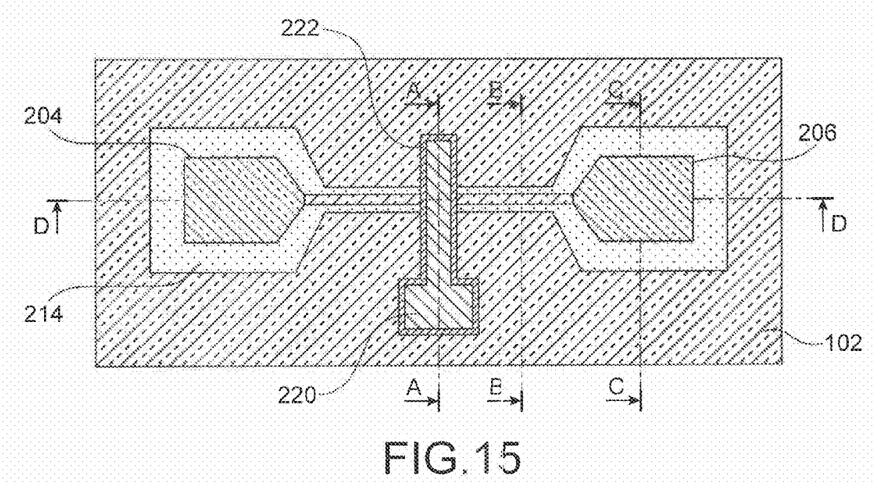
Figure 16:
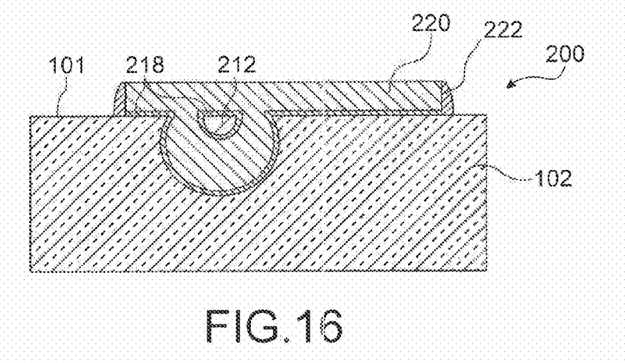
Figure 17:
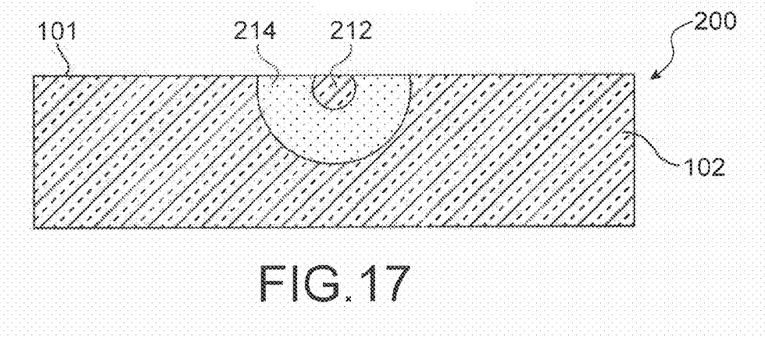
Figure 18:
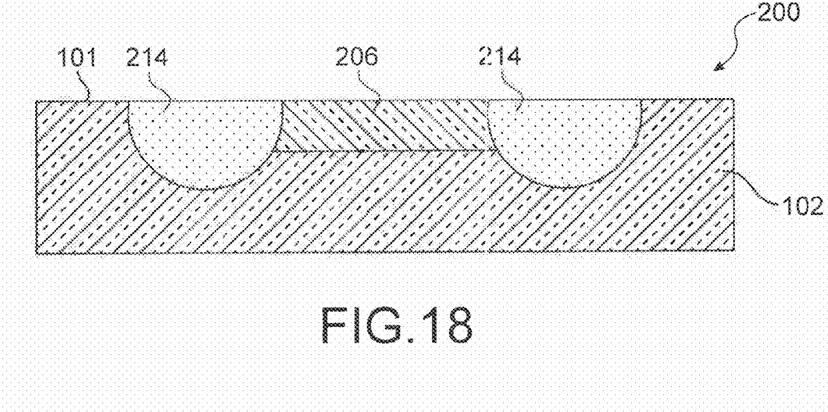
Figure 19:
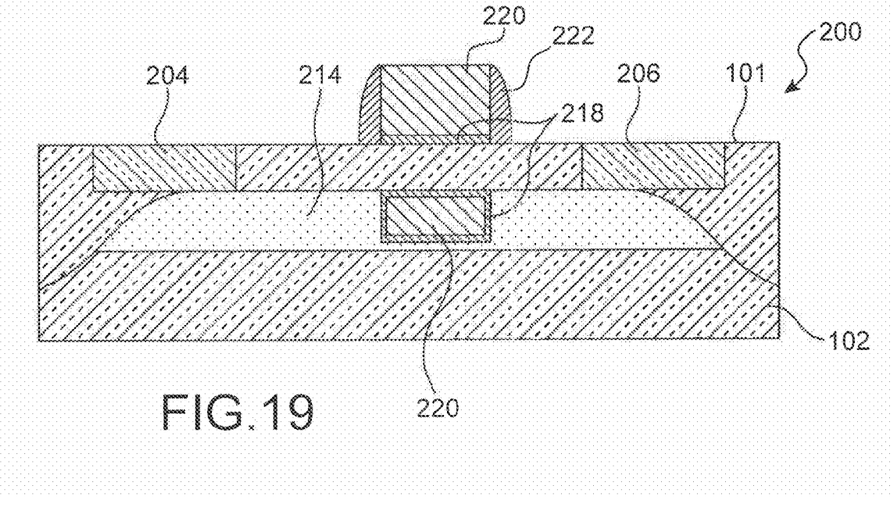

FIG. 15 shows a top view of the transistor 200 obtained. FIGS. 16, 17, 18 and 19 show sectional views of the transistor 200 obtained, respectively along axes AA, BB, CC and DD.

The invention claimed is:

1. A method for forming at least one wire in a layer based on at least one monocrystalline or amorphous material, comprising:

forming at least two trenches in the layer, crossing through one face of the layer, separated from each other by at least one portion of the monocrystalline or amorphous layer that forms the wire, by an anisotropic etching of the layer on which is arranged an etching mask including a pattern forming sections of the trenches at least at a level of the face of the layer; and annealing, under hydrogenated atmosphere, the layer, the etching mask being maintained on the portion of the monocrystalline or amorphous layer that forms the wire during the annealing, wherein depths P of the two trenches in the layer are less than the thickness of the layer, and widths L of the sections of the two trenches and a width D of a section of the portion of the monocrystalline or amorphous layer, the sections of the two trenches and the portion of the monocrystalline or amorphous layer are in a plane parallel to the face of the layer, are such that the annealing eliminates a part of the portion of the monocrystalline or amorphous layer, the two trenches then forming a single trench in which a remaining part of the portion of the monocrystalline or amorphous layer forms the wire, and P, L, and D are chosen such that:

$$\left(\pi - a\sin\left(\frac{1}{1+(D/L)}\right)\right)\left(\frac{1+(D/L)}{2}\right)^2 + \frac{1}{2}\sqrt{\frac{D/L}{2}\left(1+\frac{D/L}{2}\right)} \le$$

$$(P/L) \le 5.5 + 2.1(D/L)^2 - 0.011(D/L)^4.$$

2. The method according to claim 1, the trenches being of similar shape and dimensions.

3. The method according to claim 1, the annealing being carried out at a temperature between around 750° C. and 1150° C. and/or at a pressure between around 266 Pa and 100000 Pa.

4. The method according to claim 1, the monocrystalline or amorphous layer being a layer of silicon of an SOI substrate.

5. A method for forming an all round gate transistor, comprising:

forming a plurality of trenches in a layer based on at least one monocrystalline or amorphous material, crossing through one face of the layer and forming a contour of source, drain, and channel zones, at least two trenches among the plurality of trenches being separated from each other by at least one portion of the monocrystalline or amorphous layer configured to form the channel of the transistor, by an anisotropic etching of the layer on which is arranged an etching mask including a pattern forming sections of the trenches at least at a level of the face of the layer; and annealing, under hydrogenated atmosphere, the layer, the etching mask being maintained on the portion of the monocrystalline or amorphous layer that forms a wire during the annealing, wherein depths P of the two trenches in the layer are less than the thickness of the layer, widths L of the sections of the two trenches and a width D of a section of the portion of the monocrystalline or amorphous layer, the sections of the two trenches and the portion of the monocrystalline or amorphous layer are in a plane parallel to the face of the layer, are such that the annealing eliminates a part of the portion of the monocrystalline or amorphous layer, the two trenches then forming a single trench in which a remaining part of the portion of the monocrystalline or amorphous layer forms the wire, and P, L, and D are chosen such that:

$$\left(\pi - a\sin\left(\frac{1}{1+(D/L)}\right)\right)\left(\frac{1+(D/L)}{2}\right)^2 + \frac{1}{2}\sqrt{\frac{D/L}{2}\left(1+\frac{D/L}{2}\right)} \le$$
$$(P/L) \le 5.5 + 2.1(D/L)^2 - 0.011(D/L)^4.$$

6. The method according to claim 5, further comprising, after the annealing:

depositing a dielectric material in the trenches;

etching a portion of the dielectric material at a level of a gate zone intended to receive a gate of the transistor;

forming, at the level of the gate zone, the wire, the trench comprising the wire and a part of the monocrystalline or amorphous layer, a dielectric layer;

forming the gate on the dielectric layer surrounding the wire at the level of the gate zone;

etching the dielectric material located on the monocrystalline or amorphous layer, outside of the trenches;

forming dielectric spacers around the gate, on the monocrystalline or amorphous layer; and implanting dopants in source and drain zones.

7. The method according to claim 6, further comprising, between the annealing and the forming the gate, oxidizing the wire.

8. The method according to claim 5, the annealing being carried out at a temperature between around 750° C. and 1150° C. and/or at a pressure between around 266 Pa and 100000 Pa.

9. The method according to claim 5, the monocrystalline or amorphous layer being a layer of silicon of an SOI substrate.

* * * * *